United States Patent [19]

Takahashi et al.

[11] Patent Number: 4,551,634
[45] Date of Patent: Nov. 5, 1985

[54] MULTIPLEXING INPUT CIRCUIT

[75] Inventors: Hitoshi Takahashi, Yokohama; Satoru Yamaguchi; Hideo Nunokawa, both of Kawasaki, all of Japan

[73] Assignee: Fujitsu Limited, Kawasaki, Japan

[21] Appl. No.: 480,581

[22] Filed: Mar. 30, 1983

[30] Foreign Application Priority Data

Mar. 31, 1982 [JP] Japan .................................. 57-051143

[51] Int. Cl.⁴ .......................... H03K 17/60; H04J 3/02
[52] U.S. Cl. ..................................... 307/243; 307/241; 307/571; 307/304; 328/104; 328/137; 328/154; 370/112; 370/113
[58] Field of Search ............... 328/104, 154, 153, 105, 328/137; 370/112, 113; 307/241, 242, 243, 571, 572, 304, 254; 365/242, 231

[56] References Cited

U.S. PATENT DOCUMENTS

| | | | |
|---|---|---|---|
| 3,051,791 | 8/1962 | Young et al. | 370/113 |
| 3,614,327 | 10/1971 | Low | 179/15 A |
| 4,010,385 | 3/1977 | Krol | 307/243 |
| 4,204,131 | 5/1980 | Dozier | 307/251 |
| 4,390,988 | 6/1983 | Best et al. | 370/113 |

OTHER PUBLICATIONS

RUNDFUNKTECHNISCHE MITTEILUNGEN, vol. 20, No. 6, Dec. 1976, pp. 247-253, Hamburg, DE. P. Wurll; "Ein volelektronischer Analogschalter mit Studioqualitatsdaten in MOS-technik fur dynamische und statische Ansteurersignale", p. 249, right-hand column, last para., p. 250, FIG. 8.

IBM TECHNICAL DISCLOSURE BULLETIN, vol. 9, No. 9, Feb. 1967, pp. 1234-1235, New York, J. W. Froemke,"Insulated Gate Field Effect Transistor Circuit", p. 1234, FIG.

*Primary Examiner*—S. D. Miller
*Assistant Examiner*—Richard Roseen
*Attorney, Agent, or Firm*—Staas & Halsey

[57] ABSTRACT

An input circuit having a plurality of channels, each channel includes a conductor line, first and second transistors inserted in series into the conductor line and a third transistor.

When a channel is not selected, the first and second transistors are turned off and the third transistor is turned on to clamp the conductor line at a predetermined constant voltage. When a channel is selected, the third transistor is turned off and first and second transistors are turned on to transfer the corresponding information input therethrough.

6 Claims, 4 Drawing Figures

MULTIPLEXING INPUT CIRCUIT

BACKGROUND OF THE INVENTION

(1) Field of the Invention

The present invention relates to an input circuit, more particularly to an input circuit constructed having a plurality of channels provided with input ports and input/outputs ports and where the plurality of channels deal mainly with analog signals.

(2) Description of the Prior Art

A recent trend in many fields is for automatic data processing and, therefore, for introduction of microcomputers and the like. Such data processing involves a great deal of information. The data is input one by one and successively processed. To input the information, an input circuit having a plurality of channels is usually used. Each of the plurality of channels transfers certain kinds of information, designated thereto in advance, to a predetermined internal circuit at specified timings.

Such an input circuit is fabricated as an integrated circuit (IC). The plurality of channels, each including, for example, one or more metal-oxide-semiconductor (MOS) transistors, must be arranged with a very small pitch therebetween. This, contrary to the desired electrical independence of the plurality of channels, results in increased manual interference between, which produces undesired noise such as crosstalk. The undesired noise reduces the accuracy of the information input to the circuit and the accuracy of the data processing.

The above-mentioned problem will be analyzed in greater detail later, but, in conclusion, it is effective to fabricate the input circuit so as to, first, prevent a high voltage signal on one channel from influencing neighboring channels and, second, make the voltage level of each channel stable.

Conventionally, this is done by arranging the plurality of channels with a relatively large pitch therebetween. This, however, is disadvantageous from the viewpoint of achieving high IC density.

SUMMARY OF THE INVENTION

It is an object of the present invention to fabricate an input circuit so as to overcome the problems of mutual interference, crosstalk, incorrect input of the information, and reduced data processing accuracy.

The above object is attained by employing three transistors in each channel, each transistor being selectively turned on to fix the voltage of conductors at a predetermined level in each of the channels other than a selected channel.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Figure 1:
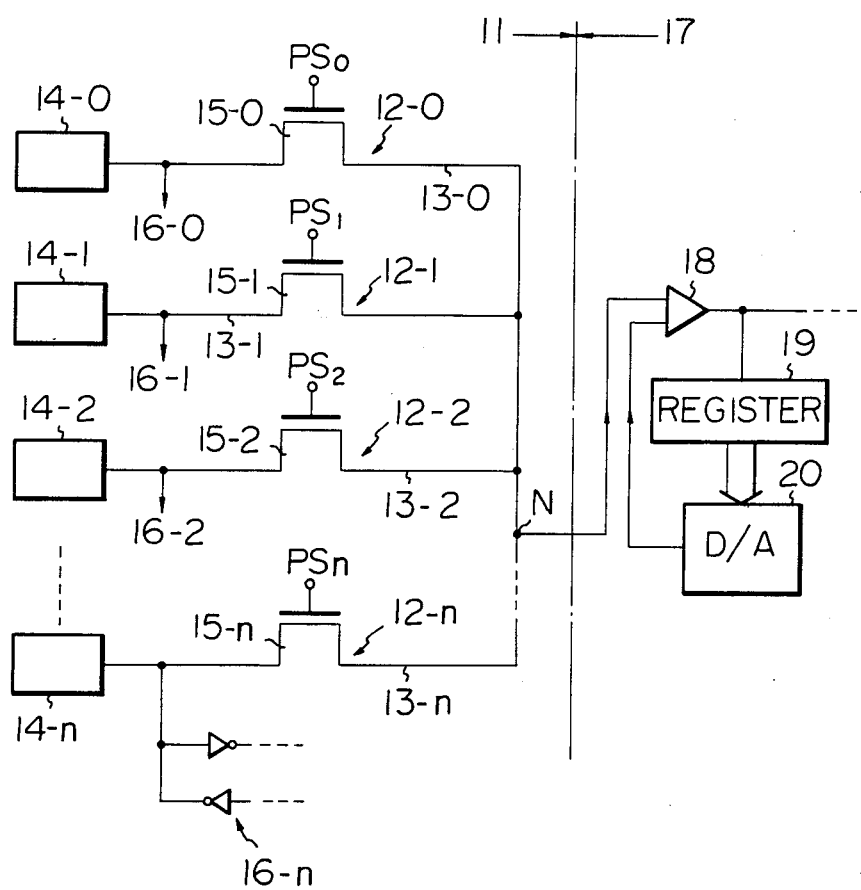
FIG. 1 is a circuit diagram of one example of a prior art input circuit.

FIG. 1 is a circuit diagram of one example of a prior art input circuit. In FIG. 1, reference numeral 11 represents, as a whole, an input circuit. The input circuit is constructed with a plurality of channels 12-0, 12-1, 12-2, - - - 12-n, each having the same construction. Taking the channel 12-1 as an example, a conductor line 13-1 is arranged therein, one end of which is connected to a port 14-1 and the other end of which is connected to a node N commonly connected to other channels, i.e., 12-0, 12-2, - - - 12-n. A transistor 15-1 is inserted in series at the middle of the conductor line.

When the input circuit 11 is mounted on a semiconductor chip provided with a microcomputer thereon, a branched route is often introduced, brancing, for example, from a portion between the port 14-1 and the transistor 15-1 and reaching a buffer 16-1. In this case, the port 14-1 functions not only as an input port, but also as an input/output port. Incidentally, in this figure, the buffer is illustrated specifically only for a buffer 16-n.

The plurality of channels 12-0 through 12-n are sequentially made active. Thus, the information for the channels is input one after another through the corresponding activated channel. In order to selectively make the plurality of channels active one after another, port selection signals $PS_0$ through $PS_n$ are applied to gates of the transistors 15-0 through 15-n at predetermined timings. In this case, if, for example, the port 14-2 is inherently used as the input/output port, the transistor 15-2 is maintained in a cut-off state by continuously supplying the signal $PS_2$ having a "L" (low) level.

The sequentially selected information inputs are supplied one by one to a predetermined internal circuit 17 mounted on the same chip. "Predetermined internal circuit" means a circuit after the input circuit 11. It is not essential in the present invention, however, to clearly define how it is constructed and for what purpose it exists. For example, the predetermined circuit 17 can be a so-called successive approximation type analog/digital (A/D) converter. In such a case, reference numeral 18 corresponds to a comparator; 19 to a successive approximation register; and 20 to a digital/analog (D/A) converter. The reason why such an A/D converter is taken as an example is that the input circuit of the present invention exhibits remarkable merits for analog signals as the aforesaid information inputs received at the ports 14-0, 14-1, and so on. To be more specific, the analog information inputs may indicate unprocessed data, for example, humidity measurement data, temperature measurement data, atmospheric pressure measurement data, or the like. These analog inputs are usually converted into digital signals, then supplied, as corresponding digital data, to the microcomputer for processing. However, the input circuit 11 has a problem, as previously mentioned, with the accuracy of the information inputs. For example, when an analog signal is received at the port with a voltage level of, for example 1 V, the analog signal incorrectly appears at the node N with an error voltage of $(1+\alpha)$ V. The present inventors found through experiments that the noise of $+\alpha V$ is produced when one or more of the ports 14-0 through 14-n are used as input/outputs ports. Assuming that, for example, the port 14-2 is used as an input/output port and, at the same time, this input/output port 14-2 receives a digital signal having a magnitude of about 5 V, as in a transistor-transistor logic (TTL) IC, the analog signal of, for example 1 V, inputted from, for example, the port 14-1, varies according to $(1+\alpha)$ V when reaching the node N. The error voltage of $+\alpha V$ is for example, about 10 mV. The value of 10 mV itself is considerably small, however, it may result in a 1 bit error when the register 19 of the predetermined internal circuit 17 is formed as an 8-bit register and the allowable maximum voltage for the A/D conversion voltage is rated at 2.56 V.

In the above example, the transistor 15-2 is maintained in a cut-off state, since the related port 14-2 is used for the input/output port. Regardless of the existence of the cut-off transistor 15-2, the noise of $+\alpha V$, induced by the digital signal of about 5 V at the port 14-2, is actually produced at the node N.

The reasons for this are not clear, but it is considered that since the transistor 15-2 is usually made of a MOS field effect transistor (FET), a slight voltage variation due to the 5 V digital signal occurs at the node N by way of parasitic capacitors between the source and drain and between the drain and gate thereof. The noise caused by the above-mentioned fact is still maintained, even if the channels are arranged with a large pitch. Also, it is considered that there is interference between the channels. This interference may occur regardless of which port is used as the input/output port. At the conductor lines 13-0 through 13-n, except for the conductor line connected to the input/output port, corresponding analog voltages successively appear at high speed. All of the analog voltage levels are not constant, but vary in accordance with corresponding information inputs. This means that any selected channel is placed under circumstances in which the voltage level is not fixed, but always variable. This fact also causes an unstable voltage level of each information input.

Figure 2:
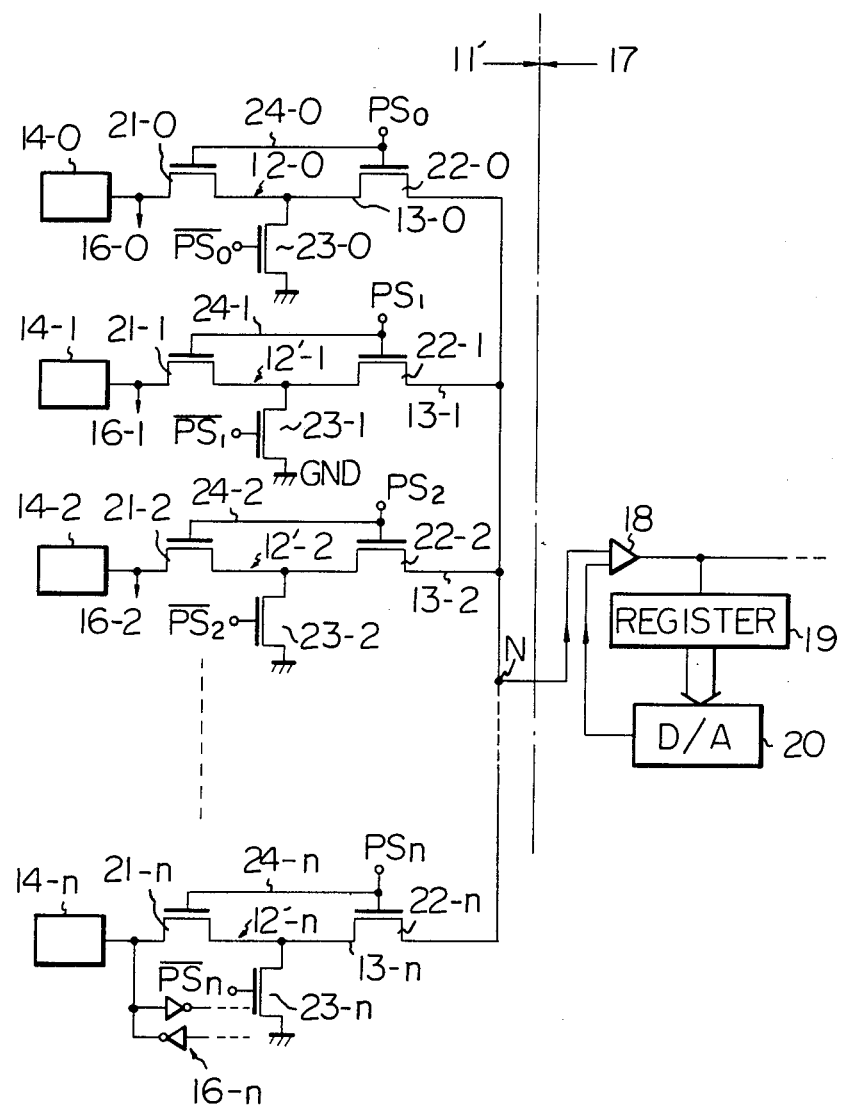
FIG. 2 is a circuit diagram of an input circuit according to an embodiment of the present invention.
Figure 3:
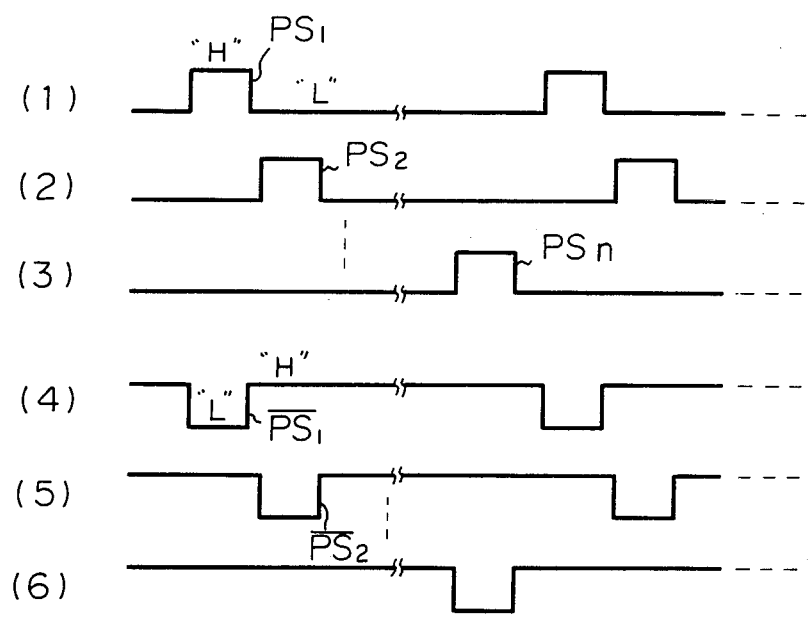
FIG. 3 depicts waveforms of port selection signals shown in FIGS. 1 and 2.

FIG. 2 is a circuit diagram of an input circuit according to an embodiment of the present invention. In FIG. 2, members the same as those of FIG. 1 are represented by the same reference numerals or symbols (same for later figures). Accordingly, is a newly proposed input circuit 11', each of the channels is comprised of three transistors. The channels have the same construction, so only one of the channels, i.e., the channel 12'-1, is referred to in the following explanation. The channel 12'-1 comprises a first transistor 21-1, a second transistor 22-1, and a third transistor 23-1. The first and second transistors 21-1 and 22-1 are inserted in series into the conductor line 13-1. The gates of these transistors are connected with each other via a gate lead 24-1. A third transistor 23-1 is connected between ground GND and a portion of the conductor line 13-1 arranged between the first and second transistors 21-1 and 22-1. Further, a port selection signal $\overline{PS_1}$ is applied to the third transistor 23-1 at its gate. The signal $\overline{PS_1}$ has an inverted level with respect to the port selection signal $PS_1$ to be applied to both gates of the first and second transistors 21-1 and 22-1. Therefore, both the first and second transistors 21-1 and 22-1 are in an on or off state with respect to an off or on state of the third transistor 23-1. It should be understood that the port selection signals $PS_0$ through $PS_n$, also $\overline{PS_0}$ through $\overline{PS_n}$, are selected one after another, as in FIG. 1. FIG. 3 depicts waveforms of port selection signals shown in FIGS. 1 and 2. Rows (1), (2), (3), (4), (5), and (6) represent the port selection signals $PS_1$, $PS_2$, $PS_n$, $\overline{PS_1}$, $\overline{PS_2}$, and $\overline{PS_n}$, respectively.

Assuming that the channel 12'-1 is in a selection state now, the corresponding port selection signal $PS_1$ is an "H" (high) level (the remaining signals $PS_0$, $PS_2$ through $PS_n$ are an "L" level). Therefore, the inverted port selection signal $\overline{PS_1}$ is the "L" level (the remaining inverted signals $\overline{PS_0}$, $\overline{PS_2}$ through $\overline{PS_n}$ are of "H"). Under these conditions, the third transistor 23-1 of the selected channel 12'-1 is turned off by the signal $\overline{PS_1}$, and, thereby, the corresponding information input given at the port 14-1 is transferred to the node N by way of the first and second transistors 21-1 and 22-1, both conductive by the signal $PS_1$. Under the same conditions as above, regarding the other channels 12'-0, 12'-2 through 12'-n, the respective conductors 13-0, 13-n through 13-2, sandwiched by the respective first and second transistors, are forcibly clamped at ground level. This is because, the third transistor of each of the nonselected channels is turned on.

The second transistor (22) for each nonselected channel is needed to prevent the thus forcibly clamped ground level from travelling into the selected channel. The thus forcibly clamped ground level on the conductor lines of the nonselected channels is effective for impeding the transfer of noise to the node N therethrough, the noise induced by signals supplied to the nonselected ports 14-0 and 14-2 through 14-n.

Due to the above-mentioned relationship between the port selection signal (PS) and the inverted port selection signal ($\overline{PS}$), taking the channel 12'-1 as an example, the conductor lines 13-0, 13-2, etc. of neighboring channels, such as 12'-0, 12'-2, are fixed at ground level. Further, the gate leads 24-0, 24-1, etc. of the neighboring channels are fixed at the "L" level. Still further, the gate lead 24-1 for channel 12'-1 now in the selection state is fixed at the "H" level. This means that the related channel 12'-1 has a stable or fixed voltage level. This also applies to other selected channels. Consequently, each information input can be transferred to the node N, maintaining the voltage level that is at its port without being affected by any external level variation.

Figure 4:
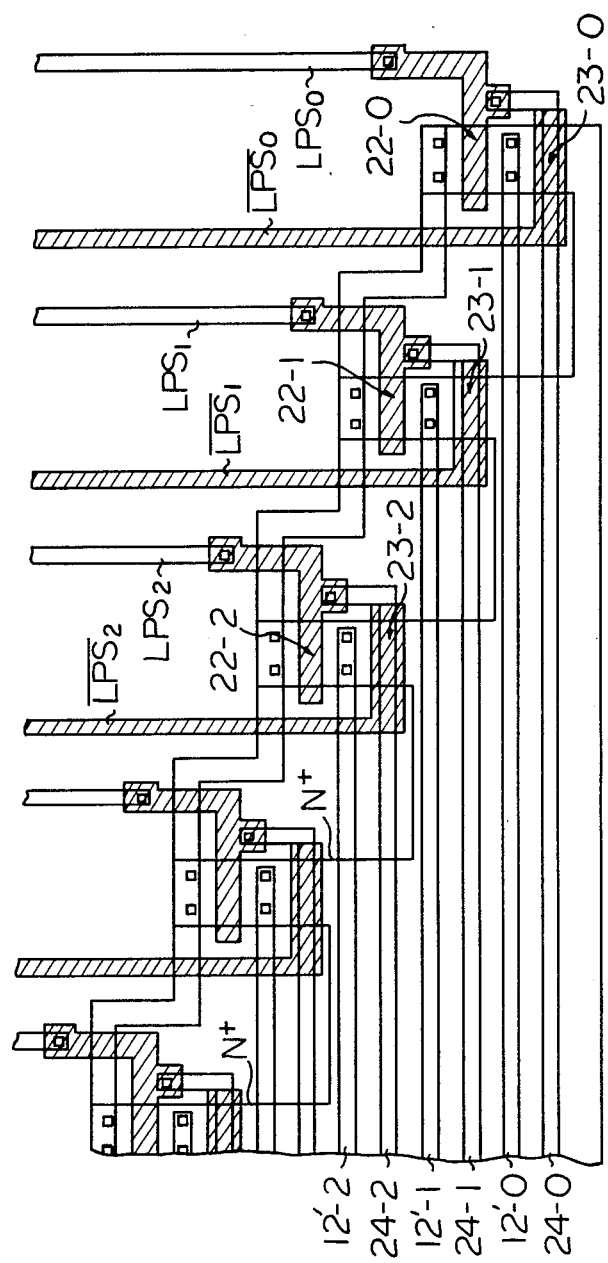
FIG. 4 is a partial top plane view of the circuit shown in FIG. 2.

FIG. 4 is a partial top plane view of the circuit shown in FIG. 2, illustrating some sets of the second and third transistors (22, 23) and their neighboring members. The members referenced with the same numerals or characters as those of FIG. 2 are identical to those of FIG. 2. Symbols $LPS_0$ through $LPS_2$ and $\overline{LPS_0}$ through $\overline{LPS_2}$, are gate conductors for transferring the signals $PS_0$ through $PS_2$ and $\overline{PS_0}$ through $\overline{PS_2}$, respectively, shown in FIG. 2. Solid lines referenced by N+ indicate an enclosure of an N+ diffusion layer. Hatchings are employed not for representing cross-sectional regions as usual, but for clearly distinguishing polysilicon layers. As understood from FIG. 4, the addition of second and third transistors (22, 23) into the circuit of FIG. 1 does not impede achievement of a high degree of IC integration. That is, the conductors 12'-0, 24-0, 12'-1, and 24-1, etc., are arranged with very small pitches, regardless of the existence of the transistors (22, 23).

As explained above in detail, according to the present invention, there is provided an input circuit, having a plurality of channels which are activated one after another, with the advantage that the information input to each selected channel can be transferred therethrough to the following predetermined internal circuit without being affected by other nonselected channels and, therefore, can be kept at the voltage level that is at its port.

We claim:

1. An input circuit for receiving an input signal and transferring the input signal to an internal circuit, the input circuit having a plurality of channels, one of the channels being selectively activated while the remaining channels are nonselected, each of the channels comprising:
an input terminal for receiving the input signal;
an output terminal operatively connected to the internal circuit;
a first transistor having a current carrying path having a first end which is connected to said first input terminal, and having a second end;
a second transistor having a current carrying path having a first end connected to the second end of said current carrying path of said first transistor, and having a second end connected to said output terminal; and
a third transistor having a current carrying path having a first end connected to a connection point between the second end of said current carrying path of said first transistor and the first end of said current carrying path of said second transistor, and having a second end connected to a predetermined constant voltage level.

2. An input circuit as set forth in claim 1, wherein the predetermined constant voltage level is defined by a ground level potential of the input circuit.

3. An input circuit as set forth in claim 2, further comprising a common gate lead having a channel selection signal with an "H" or "L" level applied thereto, wherein each of said first, second and third transistors has a gate, wherein the gates of said first and second transistors are operatively connected to said common gate lead to which the "H" or "L" level is applied and wherein the gate of said third transistor receives an inverted channel selection signal.

4. An input circuit as set forth in claim 3, further comprising a semiconductor substrate and conductor lines and common gate leads formed on the semiconductor substrate, wherein said common gate leads and said conductor lines are arranged parallel to each other on the semiconductor substrate and wherein each one of said common gate leads is sandwiched by a neighboring pair of said conductor lines.

5. An input circuit as set forth in claim 1, wherein said internal circuit is an analog/digital converter.

6. An input circuit receiving input signals, port selection signals and inverted port selection signals, comprising:
input/output ports for receiving and transmitting the input signals;
channels, operatively connected to said input/output ports, for receiving and transmitting the input signal and for receiving the port selection signals and the inverted port selection signals, each of said channels comprising:
a first transistor having a gate and operatively connected to receive the port selection signals and, having a current carrying path having a first end connected to said input port of said input/output ports, and having a second end;
a second transistor having a gate operatively connected to the gate of said first transistor and operatively connected to receive the port selection signals and, having a current carrying path having a first end connected to the second end of said current carrying path of said first transistor, and having a second end connected to said output port of said input/output ports; and
a third transistor having a gate operatively connected to receive the inverted port selection signals and, having a current carrying path having a first end connected at a connection point between the second end of said current carrying path of said first transistor and the first end of said current carrying path of said second transistor, and having a second end connected to ground.

* * * * *

UNITED STATES PATENT AND TRADEMARK OFFICE
CERTIFICATE OF CORRECTION

PATENT NO. : 4,551,634
DATED : NOVEMBER 5, 1985
INVENTOR(S) : HITOSHI TAKAHASHI ET AL.

It is certified that error appears in the above-identified patent and that said Letters Patent is hereby corrected as shown below:

```
FRONT PAGE, Col. 2, line 2, "volelektronischer" should be
                    --vollelektronischer--.

Col. 1, line 10, "outputs" should be --output--;
         line 29, "between" should be --therebetween--;
         line 52, "on" should be --on or off so as--.

*Col. 2, line 14, "line." should be --line 13-1.--;
         line 17, "brancing" should be --branching--;
         line 64, "outputs" should be --output--.

Col. 3, line 4, "is" should be --is,--;
         line 40, "is" should be --in--.

*Col. 4, line 12, "13-n through 13-2" should be
                 --13-2 through 13-n--.
```

Signed and Sealed this

Eighteenth Day of February 1986

[SEAL]

Attest:

DONALD J. QUIGG

Attesting Officer

Commissioner of Patents and Trademarks